US006809259B2

(12) United States Patent
Sridhar et al.

(10) Patent No.: US 6,809,259 B2
(45) Date of Patent: Oct. 26, 2004

(54) THROUGH TERMINAL AND X-RAY TUBE

(75) Inventors: Gorur N. Sridhar, Bangalore (IN); Uma Sridharan, Bangalore (IN); Manohar G. Kollegal, Bangalore (IN)

(73) Assignee: GE Medical Systems Global Technology Company, LLC, Waukesha, WI (US)

( * ) Notice: Subject to any disclaimer, the term of this patent is extended or adjusted under 35 U.S.C. 154(b) by 0 days.

(21) Appl. No.: 10/425,751

(22) Filed: Apr. 29, 2003

(65) Prior Publication Data

US 2003/0201112 A1 Oct. 30, 2003

(30) Foreign Application Priority Data

Apr. 30, 2002 (JP) ....................................... 2002-127854

(51) Int. Cl.[7] .................................................. H05K 5/06

(52) U.S. Cl. ........... 174/50.5; 174/50.56; 174/152 GM; 439/935

(58) Field of Search ............................ 174/50.5, 50.56, 174/50.61, 152 GM, 153 R, 50; 439/935, 685; 378/200, 141, 199

(56) References Cited

U.S. PATENT DOCUMENTS 3,719,918 A 3/1973 Kerr
4,778,949 A 10/1988 Esterle et al.
5,247,563 A 9/1993 Block et al.
5,259,790 A 11/1993 Hayward
5,285,492 A 2/1994 Janouin et al.
6,542,577 B1 4/2003 Kaczmarek et al.

*Primary Examiner*—Dhiru R Patel
(74) *Attorney, Agent, or Firm*—Carl B. Horton, Esq.; Armstrong Teasdale LLP

(57) ABSTRACT

This invention aims to provide a through terminal capable of maintaining air-tightness stably and an X-ray tube having the through terminal. The through terminal includes a tubular member, a plate member formed of an insulating ceramic material and bonded to an inner periphery of the tubular member in a hermetically sealed state, and pins extending through the plate member so that the portions thereof fitted through the plate member are located inside metallic tubes respectively and bonded to the plate member in a hermetically sealed state through the tubes. The tubular member is provided on an inner periphery thereof with a stepped portion for abutment thereagainst of a plate face of the plate member. The tubular member is formed of an alloy including at least iron, nickel, and cobalt.

8 Claims, 2 Drawing Sheets

THROUGH TERMINAL AND X-RAY TUBE

CROSS REFERENCE TO RELATED APPLICATIONS

This application claims the benefit of Japanese Application No. 2002-127854 filed Apr. 30, 2002.

BACKGROUND OF THE INVENTION

The present invention relates to a through terminal and an X-ray tube, particularly a through terminal for electric connection between the inside and the outside of a hermetically sealed vessel, as well as an X-ray tube having such a through terminal.

The interior of an X-ray tube is held in vacuum. The supply of voltage and current to an internal electrode of an X-ray tube is performed through a through terminal. The through terminal has a hermetically sealed structure. The through terminal is made up of a tubular member, an electrically insulating plate member bonded in a hermetically sealed state to an inner periphery of the tubular member, and an electrically conductive pin extending through the plate member in a hermetically sealed state. The bonding of the components for ensuring a hermetic seal is performed by soldering. The soldering is performed by applying high temperature.

In a through terminal of an X-ray tube, since a plate member is constituted by glass, the air-tightness is apt to be impaired by the influence of, for example, a residual stress of after soldering.

SUMMARY OF THE INVENTION

Therefore, it is an object of the present invention to realize a through terminal capable of maintaining air-tightness stably and an X-ray tube having such a through terminal. The through terminal according to the present invention is applicable widely to uses in which the inside and the outside of a hermetically sealed vessel are connected with each other electrically.

According to the present invention, for solving the above-mentioned problem, there is provided a through terminal comprising a tubular member, a plate member formed of an insulating ceramic material and bonded to an inner periphery of the tubular member in a hermetically sealed state, and a pin formed of an electrically conductive material and extending through the plate member, the portion of the pin which portion extends through the plate member being located inside a metallic tube and the pin being bonded to the plate member in a hermetically sealed state through the metallic tube.

In the present invention, the plate member is constituted by an insulating ceramic material and the pin formed of an electrically conductive material and extending through the plate member is disposed so that its portion extending through the plate member is located inside a metallic tube and bonded to the plate member in a hermetically sealed state through the metallic tube. Consequently, it is possible to realize a through terminal capable of maintaining air-tightness stably.

To make positioning easy, it is preferable that the tubular member have on its inner periphery a stepped portion for abutment thereagainst of a plate face of the plate member.

To make bonding of the plate member, it is preferable that the tubular member be formed of an alloy comprising at least iron, nickel, and cobalt.

Likewise, to make bonding of the plate member easy, it is preferable that the tubular member be formed of stainless steel.

To maintain air-tightness stably, it is preferable that the X-ray tube have a through terminal of the foregoing construction.

According to the present invention, it is possible to realize a through terminal capable of maintaining air-tightness stably and an X-ray tube having such a through terminal.

Further objects and advantages of the present invention will be apparent from the following description of the preferred embodiments of the invention as illustrated in the accompanying drawings.

DETAILED DESCRIPTION OF THE INVENTION

Figure 1:
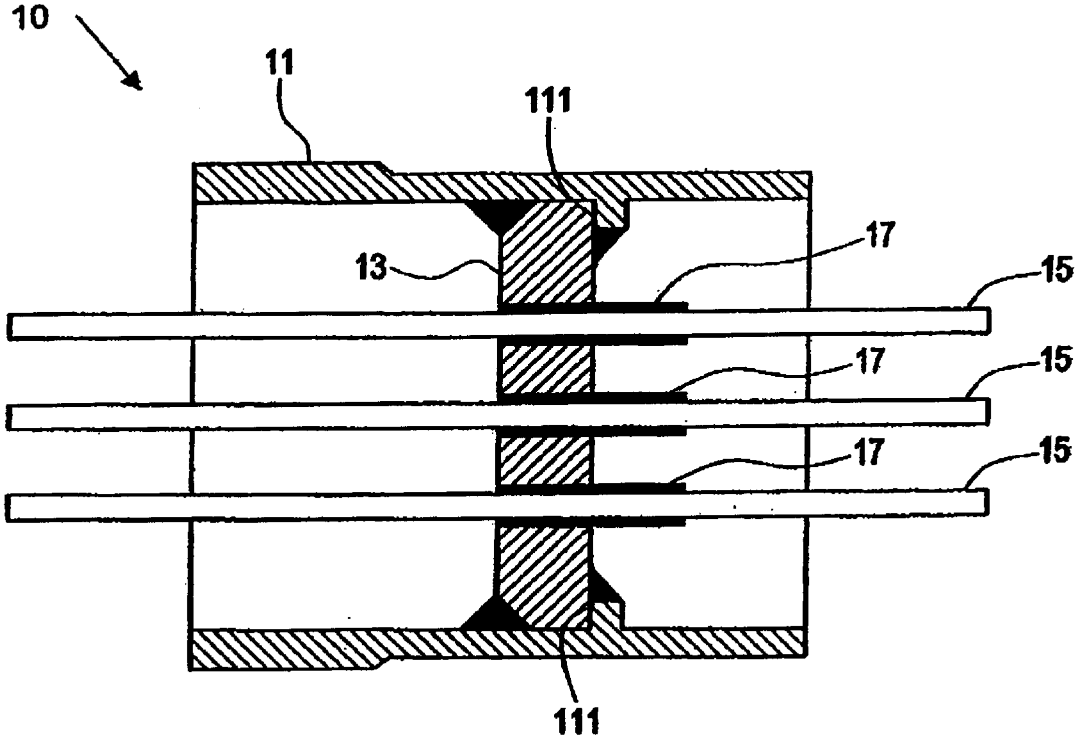
FIG. 1 is a sectional view showing an embodiment of the present invention.
Figure 2:
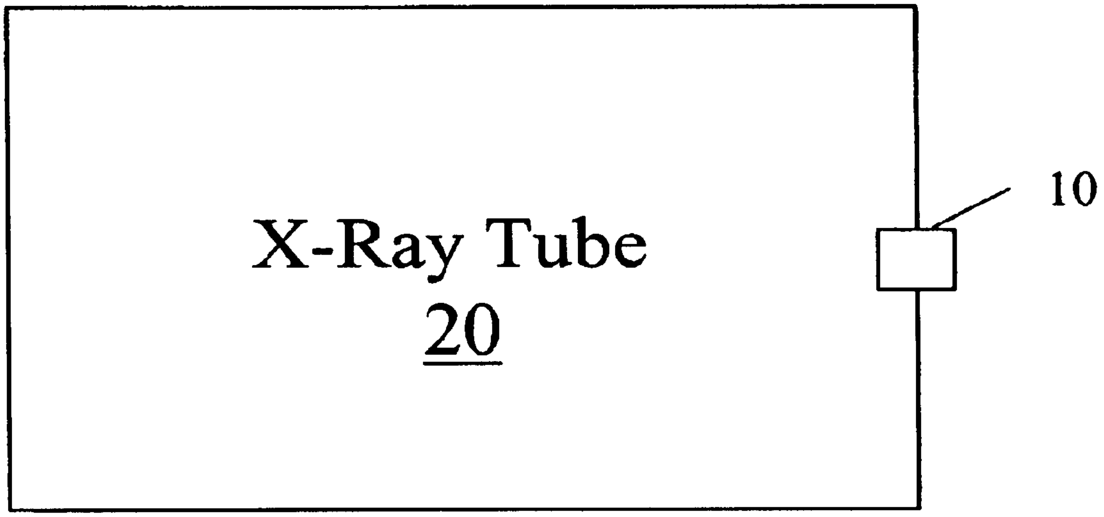
FIG. 2 is a schematic illustration of a through terminal coupled to an X-ray source.

An embodiment of the present invention will be described in detail hereunder with reference to the accompanying drawings. FIG. 1 is a sectional view showing the structure of a through terminal 10 according to an embodiment of the present invention. With the construction of this through terminal 10 there is shown a working example of the through terminal 10 of the invention.

As shown in the same figure, the through terminal has a tubular member 11. The tubular member 11 is a generally cylindrical member. The shape of the tubular member is not limited to the cylindrical shape, but may be any other cylindrical shape having a suitable sectional shape. The tubular member 11 is a working example of the tubular member defined in the present invention.

As the material of the tubular member 11 there is used Kovar (trade name) for example. Kovar is an alloy comprising iron (Fe), nickel (Ni), cobalt (Co) and other components. Kovar is preferred in point of being superior in its bondability to a plate member made of a ceramic material which will be described later. The material of the tubular member 11 is not limited to Kovar, but may be stainless steel. Stainless steel is also superior in its bondability to ceramics and is less expensive than Kovar.

A plate member 13 is mounted in the interior of the tubular member 11. As the material of the plate member 13 there is used an electrically insulating ceramic material. The plate member 13 is formed so that the contour thereof fits an inner periphery of the tubular member 11. In this embodiment, the inner periphery of the tubular member 11 is circular and the plate member 13 is in the shape of a disc correspondingly. The plate member 13 is a working example of the plate member defined in the present invention.

The plate member 13 is mounted in a state such that it is abutted on one side thereof against a stepped portion 111 formed on the inner periphery of the tubular member 11. The stepped portion 111 is formed by a shelf-like structure projecting inwards from an inner wall surface of the tubular member 11. With the stepped portion 111, the position of the plate member 13 in the interior of the tubular member 11 is determined unambiguously. The stepped portion 111 is a working example of the stepped portion defined in the present invention.

Since the position of the plate member 13 in the interior of the tubular member 11 is determined by a mere abutment of one plate face of the plate member 13 against the stepped portion 111, it is possible to effect-positioning easily without using any special jig.

Bonding of the plate member 13 to the tubular member 11 is performed by soldering. The soldering is performed in peripheral edge portions of the plate member 13. More specifically, as indicated with solid ink triangulars, peripheral edge portions on both sides of the plate member 13 are soldered to the inner periphery of the tubular member 11.

For the soldering there is used a suitable solder material such as silver solder for example. The solder material melts at a high temperature exceeding 1000° C. to bond the plate member 13 and the tubular member 11 with each other. When cooled to room temperature, the solder material bonds the two strongly. The soldered portions have a high air-tightness.

Pins 15 extend through the plate member 13. Although three pins are used in this embodiment, the number of pins is not limited to three, but may be any other suitable number. Each of the pins 15 is disposed so that its portion extending through the plate member 13 is located inside a tube 17 and is bonded to the plate member through the tube 17. Bonding between the pin 15 and the tube 17 and bonding between the tube 17 and the plate member 13 are both effected by soldering. The pin 15 is a working example of the pin defined in the present invention. The tube 17 is also a working example of the tube defined in the present invention.

The tube 17 is a metallic tube. As the material of the tube there is used Kovar for example. Each pin is formed of an electrically conductive material, e.g., copper.

Kovar is superior to both ceramics and electrically conductive materials in the bondability by soldering. Consequently, it is possible to effect bonding between the plate member 13 and the tubes 17 and bonding between the tubes 17 and the pins 15 strongly in high air-tightness.

Thus, since a ceramic material is used as the material of the plate member 13 and the pins 15 for electric connection are fitted through the plate member 13 with the metallic tubes 17 interposed therebetween, it is possible to maintain air-tightness stably irrespective of a residual stress for example after the soldering.

Such a through terminal 10 is attached to an X-ray tube 20. In a mounted state thereof to the X-ray tube 20, the left-hand side in the figure is a vacuum side and the right-hand side is an atmosphere side, with the plate member 13 as a boundary. With use of such a through terminal 10, air-tightness of the X-ray tube 20 is maintained stably.

Many widely different embodiments of the invention may be configured without departing from the spirit and the scope of the present invention. It should be understood that the present invention is not limited to the specific embodiments described in the specification, except as defined in the appended claims.

What is claimed is:

1. A through terminal comprising:

a tubular member;

a plate member formed of an insulating ceramic material and bonded to an inner periphery of the tubular member in a hermetically sealed state; and a pin formed of an electrically conductive material and extending through the plate member, the portion of the pin which extends through the plate member being located inside a metallic tube and bonded to the plate member in a hermetically sealed state through the metallic tube.

2. The through terminal of claim 1, wherein the tubular member has on the inner periphery thereof a stepped portion for abutment thereagairist of a plate face of the plate member.

3. The through terminal of claim 1, wherein the tubular member is formed of an alloy comprising at least iron, nickel, and cobalt.

4. The through terminal of claim 1, wherein the tubular member is formed of stainless steel.

5. An X-ray tube having a through terminal for electric connection, said through terminal comprising:

a tubular member;

a plate member formed of an insulating ceramic material and bonded to an inner periphery of the tubular member in a hermetically sealed state; and a pin formed of an electrically conductive material and extending through die plate member, the portion of the pin which extends through the plate member being located inside a metallic tube and bonded to the plate member in a hermetically scaled state through the metallic tube.

6. An X-ray tube in accordance with claim 5 wherein said tubular member has on the inner periphery thereof a stepped portion for abutment thereagainst of a plate face of the plate member.

7. An X-ray tube in accordance with claim 5 wherein said tubular member is formed of an alloy comprising at least iron, nickel, and cobalt.

8. An X-ray tube in accordance with claim 5 wherein said tubular member is formed of stainless steel.

* * * * *

UNITED STATES PATENT AND TRADEMARK OFFICE

CERTIFICATE OF CORRECTION

PATENT NO. : 6,809,259 B2 
DATED : October 26, 2004
INVENTOR(S) : Sridhar et al.

It is certified that error appears in the above-identified patent and that said Letters Patent is hereby corrected as shown below:

Column 4,
Line 21, delete "thereagairist" and insert -- thereagainst --.
Line 36, delete "through die" and insert -- through the --.
Line 39, delete "scaled" and insert -- sealed --.

Signed and Sealed this

Thirteenth Day of June, 2006

JON W. DUDAS
*Director of the United States Patent and Trademark Office*